United States Patent [19]

Hani et al.

[11] Patent Number: 4,894,271
[45] Date of Patent: Jan. 16, 1990

[54] METAL-CORE PRINTED WIRING BOARD AND A PROCESS FOR MANUFACTURE THEREOF

[75] Inventors: Kiyoshi Hani; Mutsuko Hayama; Yoshio Nishimoto, all of Hyogo; Hiroshi Hishiki; Minoru Kimura, both of Kanagawa; Tatsushi Nakai, Hyogo, all of Japan

[73] Assignee: Mitsubishi Denki Kabushiki Kaisha, Tokyo, Japan

[21] Appl. No.: 190,986

[22] Filed: May 6, 1988

[30] Foreign Application Priority Data

May 6, 1987 [JP] Japan .................... 62-110016

[51] Int. Cl.$^4$ .............................................. B32B 3/00
[52] U.S. Cl. ................................. 428/137; 428/209; 428/210; 428/211; 428/457; 428/469; 428/901; 156/89; 174/264; 361/397
[58] Field of Search ............ 428/137, 209, 210, 211, 428/901, 457, 469; 156/89; 174/68.5; 361/397

[56] References Cited

U.S. PATENT DOCUMENTS

| | | | |
|---|---|---|---|
| 4,374,702 | 2/1983 | Turbak et al. | 162/9 |
| 4,483,743 | 11/1984 | Turbak et al. | 162/9 |
| 4,743,299 | 5/1988 | Pryor et al. | 174/52 R |

Primary Examiner—Jose G. Dees
Assistant Examiner—P. J. Ryan
Attorney, Agent, or Firm—Sughrue, Mion, Zinn, Macpeak & Seas

[57] ABSTRACT

Method of printed circuit board manufacture, and resulting board. A plurality of prepreg sheets composed of ceramic paper and containing different quantities of a resin are laid on each side of a core metal sheet having a through hole. A copper foil is laid on the prepreg sheets on each side of the core. All of the layers are pressed together under heat to make a metal-core printed wiring board. The prepreg sheets form an insulating layer having a high heat-dissipating capacity on each side of the core and a reliable insulator in its through hole. The ceramic paper consists essentially of short ceramic fibers having a diameter not exceeding fiber microns and a length of 5 to 500 microns, and contains 3 to 10% by weight of microfibrillated cellulose fibers as a binder for the ceramic fibers.

13 Claims, 1 Drawing Sheet

METAL-CORE PRINTED WIRING BOARD AND A PROCESS FOR MANUFACTURE THEREOF

BACKGROUND OF THE INVENTION

This invention relates to a metal-core printed wiring board, particularly one having a high heat-dissipative capacity, and to a process for manufacturing it. The development of small and sophisticated electronic parts and of high-density packaging techniques therefor have resulted in a strong demand for such printed wiring boards.

A metal-core printed wiring board has a wiring pattern formed on a metal core base which is coated with an insulating material. A base with a metal core has a number of advantages over a base formed of other material such as glass or an epoxy resin. These advantages include higher heat-dissapating capacity, higher mechanical strength, better electromagnetic sheilding effect and, lower manufacturing cost. Thus, there are known a variety of types of metal-core printed wiring boards and a variety of processes for manufacturing them.

One of these processes is disclosed in Japanese Laid-Open Patent Specification No. 74091/1983, in which a sheet of aluminum having a through hole is electrically insulated by Alumite treatment (anodic oxidation), and a wiring pattern is formed thereon by copper plating. This process has a number of drawbacks. First, only a sheet of aluminum may be used as the metal core. Further, the insulated portion of the board can withstand only a low voltage, and does not permit the mounting thereon of any component part of the kind to which a high voltage is applied. Third, both the Alumite treatment and the formation of a wiring pattern by copper plating take a long time.

Another known process is disclosed in Japanese Laid-Open Patent Specification No. 132989/1983, in which a metal sheet having a through hole, a prepreg sheet composed of a fabric of glass and an epoxy resin, and a copper foil are pressed together, whereby the prepreg sheet forms an insulating layer and a part of the resin flows from the prepreg sheet to fill the through hole, while the copper foil is simultaneously bonded to the prepreg. A circuit pattern then is formed on the base by a known subtractive process. However, the epoxy resin filling the through hole has a coefficient of linear expansion which differs substantially from that of the metal forming the core of the base. As a result, the resin is likely to separate easily from the through hole when a solder heat resistance test or a heat cycle test is conducted on the base. Moreover, as the glass and epoxy resin forming the insulating layer have a low thermal conductivity, the base as a whole also has a low thermal conductivity, and so cannot dissipate heat satisfactorily.

In other known processes, an insulating layer if formed by the electrodeposition of an insulating material on a core, or the fluidized bed coating of a core with a powdery paint. However, these processes still have various problems, as discussed above. A circuit pattern may be difficult to form; the insulating material may have a coefficient of thermal expansion which is substantially different from that of the metal forming the core; or the insulating layer may have a low thermal conductivity.

SUMMARY OF THE INVENTION

In view of the foregoing, it is an object of this invention to provide an improved metal-core printed wiring board which has on each side of a metal core and in each through hole an insulating layer having a high thermal conductivity and coefficient of linear expansion differing only slightly from that of the core metal, and adhering closely to the core.

It is another object of this invention to provide a process for manufacturing an improved metal-core printed wiring board which is particularly characterized by including improved insulating layers.

These objects are attained essentially by employing ceramic paper to form the insulating layers. The ceramic paper may be composed primarily of short ceramic fibers having a diameter not exceeding five microns and a length of 5 to 500 microns and may further contain 3 to 10% by weight of microfibrillated cellulose fibers as a binder for the short ceramic fibers. The insulating layer on each side of the metal core preferably is formed from at least two prepreg sheets composed of ceramic paper and containing different quantities of a resin.

The metal-core printed wiring board of this invention has a high heat-dissipating capacity, and can be fabricated by any conventional type of equipment that is used for manufacturing printed wiring boards. Using ceramic fibers having a higher thermal conductivity than that of a fabric or glass enables the formation of insulating layers having greatly improved thermal conductivity, yielding a base having a gratly improved heat dissipating capacity. Also, the presence of short ceramic fibers in the insulating layer in each through hole contributes to improving greatly the dissipation of heat away from the through hole and the heat resistance of the insulating layer.

Other features and advantages of this invention will be apparent from the following detailed description and the accompanying drawings.

DETAILED DESCRIPTION OF THE PREFERRED EMBODIMENT

The manufacture of a metal-core printed wiring board by a process embodying this invention will now be described more specifically with reference to the drawings. First, preparation of ceramic paper and prepreg sheets used in the fabrication of a printed wiring board will be described.

The ceramic paper which is used for making a prepreg sheet is prepared from short ceramic fibers having a diameter not exceeding five microns and a length ranging from 5 to 500 microns. Specific examples of the ceramic fibers which can be used include alumina, alumina silicate, mullite, spinel, beryllia, boron, boron nitride, silicon nitride and aluminum nitride fibers. Glass fibers can be used as well, if they have the above-mentioned diameters and lengths. The fibers can be prepared by cutting continuous fibers appropriately, by melt-spinning, by a liquid- or gas-phase reaction, or by a process employing a precursor, among others. Whiskers also can be used.

The short ceramic fibers are appropriately dispersed in water, and microfibrillated cellulose fibers having a diameter not exceeding one micron are added as an organic binder. The added cellulose fibers may be from 3 to 10% by weight of the ceramic fibers. The two kinds of fibers are mixed together uniformly to form a slurry. The ceramic paper is made from the slurry by a known paper-making process and is dried by heat.

The ceramic paper then is impregnated with a solution of a synthetic resin and is dried to yeild a prepreg sheet. The resin may be a phenol, diallyl phthalate, epoxy, polyester, or polyimide resin, or any other synthetic resin that is usually employed for making a printed wiring board. A prepreg sheet having an appropriate resin content can be obtained if a resin solution having an appropriate concentration is employed. At least two prepreg sheets having different resin contents usually are employed to form an insulating layer.

Figure 1A:
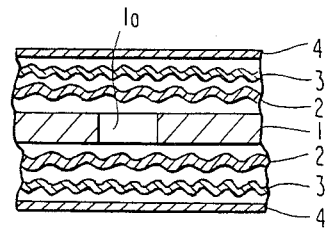
FIGS. 1A and 1B are fragmentary sesctional views showing two different stages, respectively, of manufacture of a metal-core printed wiring board by a process in accordance with the present invention.

Now, fabrication of a wiring board will be described with reference to the drawings. Referring first to FIG. 1A, a prepreg sheet 2 having a relatively high resin content is laid on each side of a metal sheet 1 having a through hole 1a. Then, a prepreg sheet 3 having a relatively low resin content is laid on each prepreg sheet 2. Finally, a metal foil 4 is laid on each prepreg sheet 3. The laminated assembly then is heat-pressed.

Figure 1B:
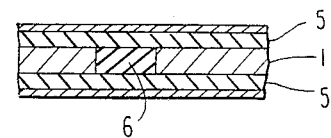
Figure 2:
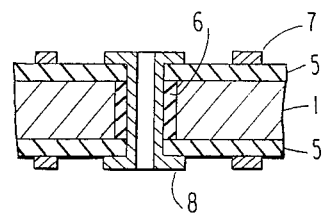
FIG. 2 is a fragmentary sectional view of a board having wiring patterns formed on a base fabricated by the process shown in FIGS. 1A and 1B.

As a result, an insulating layer 5 is formed on each side of the metal sheet 1 by the ceramic paper and the resin, as shown in FIG. 1B. Simultaneously, an insulating layer 6 also is formed in the through hole 1a as the ceramic paper is destroyed by the pressure of the resin flowing from the prepreg sheets into the hole 1a, as also is shown in FIG. 1B. A through hole having a diameter which is smaller than that of the through hole 1a is made in the insulating layer 6 coaxially with the through hole 1a. Then, a known subtractive process is employed for making a through-hole conductor 8 by copper plating and forming a wiring circuit pattern 7 on each insulating layer 5, to produce a metal-core printed wiring board in accordance with the invention as shown in FIG. 2.

Because the inner prepreg sheets 2 contain a relatively large quantity of resin, the ceramic paper is destroyed by the resin when the resin flows under pressure, and a mixture of the resulting ceramic fibers and the resin fills the through hole 1a to form the insulating layer 6. On the other hand, the ceramic fibers in the outer prepreg sheets 3 retain their paper form, since they contain a relatively small quantity of resin, and the ceramic paper and the resin form the insulating layers 5. Therefore, each insulating layer 5 or 6 is a uniform mixture of the ceramic fibers and the synthetic resin.

The insulating layers 5 and 6 have a thermal conductivity of 0.7 to 1.1 W/mK and a coefficient of linear expansion ranging from $14 \times 10^{-6}$ to $20 \times 10^{-6}/°C$. Therefore, the insulating layers on the wiring board according to the present invention have a higher thermal conductivity and a lower coefficient of linear expansion than those of any conventional insulating layer formed on a metal-core printed wiring board from a prepreg sheet composed of a fabric of glass, or from a mixture of a synthetic resin and an inorganic filler.

The metal foils are firmly joined to the metal core by the insulating layers when they are pressed together under heat, and so the foils facilitate the formation of circuit patterns by a known subtractive process. The high thermal conductivity and low linear expansibility of the short ceramic fibers in the insulating layers in which they are uniformly distributed contribute greatly to improving the heat dissipating capacity, through-hole reliability, solder heat resistance, and heat-cycle resistance of the metal-core printed wiring board.

The invention now will be described more specifically with reference to an example thereof. However, it should be understood that the following description is not intended to limit the scope of the invention.

EXAMPLE (1) Alumina paper having a thickness of 350 microns, a weight of 80 g/m² and an organic binder content of 4% by weight was prepared by employing short alumina fibers having a diameter of three microns and a length of 20 to 500 microns (product of Mitsubishi Chemical Company) and microfibrillated cellulose (product of Daicel Chemical Company known as MFC) as an organic binder for the alumina fibers.

(2) The alumina paper was impregnated with an epoxy resin (A) as shown in Table 1 below and was dried at a temperature of 130° C. for 10 minutes to produce two prepreg sheets (A) having a resin content of 50% by weight. Likewise, two prepreg sheets (B) having a resin content of 30% by weight were prepared by employing an epoxy resin (B).

TABLE 1

| Composition | Epoxy resin (A) | Epoxy resin (B) |
|---|---|---|
| EPICOAT 1045-B-80 | 100.00 g | 100.00 g |
| Dicy | 3.20 g | 3.20 g |
| BDMA | 0.16 g | 0.16 g |
| Methyl cellosolve | 50.00 g | 150.00 g |

(3) A plurality of appropriately located through holes having a diameter of 1 to 3 mm were made by a numerically controlled drilling machine in an aluminum sheet having a thickness of 1 mm (designated by JIS and A1100P).

(4) The prepreg sheets (A) were laid on opposite respective sides of the aluminum sheet, and the prepreg sheets (B) were laid on respective ones of the prepreg sheets (A). A copper foil having a thickness of 18 microns and having a roughened surface on one side thereof (product of, e.g., Nippon Mining Company) was laid on each of the prepreg sheets (B). The overall assembly was pressed together under a pressure of 50 kg/cm² at a temperature of 170° C. for 60 minutes.

(5) A through hole having a diameter of 0.8 to 2.8 mm was made by a numerically controlled drilling machine in an insulating layer coaxially with each through hole of the aluminum sheet. As a result, an insulating layer having a thickness of about 100 microns was formed in each through hole of the aluminum sheet, while the insulating layer which had been formed on each side of the aluminum sheet had a thickness of 90 microns. The insulating layers had a thermal conductivity of 0.75 W/mK and a coefficient of linear expansion of $16 \times 10^{-6}/°C$.

(6) Then, a conductor in each through hole and a wiring pattern on each side of the pressed assembly were formed by a known subtractive process, to fabricate a metal-core printed wiring board as an embodiment of the invention.

While the invention has been described above with reference to a specific embodiment, various modifications within the spirit of the invention will be apparent to ordinarily skilled artisans. Thus, the invention should be considered as limited only by the scope of the appended claims, which follow immediately.

What is claimed is:

1. A metal-core printed wiring board, comprising:
   (a) a metal core having a core wall defining a through hole extending between two major surfaces of said metal core;
   (b) a pair of insulating layers, one of said insulating layers being formed on a respective one of said surfaces of said core, said insulating layers containing ceramic paper, wherein said ceramic paper consists essentially of short ceramic fibers having a maximum diameter of five microns and a length of 5 to 500 microns and contains 3 to 10% by weight of microfibrillated cellulose fibers as a binder for said ceramic fibers, said microfibrillated cellulose fibers having a diameter of no more than one micron;
   (c) two wiring patterns, each of said wiring patterns being formed on respective ones of said insulating layers; and
   (d) a through hole conductor extending through said through hole of said core for connecting said wiring patterns electrically to each other, an insulator being formed between said through hole conductor and said core wall, said insulator comprising a material which is substantially identical in composition to said ceramic paper.

2. A printed wiring board as set forth in claim 1, wherein said ceramic fibers comprise fibers selected from the group consisting of alumina, alumina silicate, mullite, spinel, beryllia, boron, boron nitride, silicon nitride, aluminum nitride, and glass fibers.

3. A printed wiring board as set forth in claim 1, wherein said ceramic paper is impregnated with a synthetic resin selected from the group consisting of phenol, diallyl phthalate, epoxy, polyester, and polyimide resin.

4. A printed wiring board as set forth in claim 1, wherein said core is aluminum.

5. A process for manufacturing a metal-core printed wiring board, said process comprising the following steps:
   (a) laying a plurality of prepreg sheets composed of ceramic paper impregnated with a resin on each of two major surfaces of a metal core having a core wall defining a through hole, wherein said ceramic paper consists essentially of short ceramic fibers having a maximum diameter of five microns and a length of 5 to 500 microns and contains 3 to 10% by weight of microfibrillated cellulose fibers as a binder for said ceramic fibers, said microfibrillated cellulose fibers having a diameter of no more than one micron;
   (b) laying a wiring pattern forming conductor over said prepreg sheet on each side of said metal core to form an assembly;
   (c) pressing said assembly under heat, such that said through hole is filled with an insulating material, while an insulating layer is formed on each of said major surfaces of said core; and
   (d) forming a through hole conductor extending through said through hole in said insulating material and a wiring pattern from said conductor on said insulating layer, while an insulator of a material which is substantially identical in composition to said prepreg sheets is formed between said through hole conductor and a core wall defining said through hole of said core.

6. A process as set forth in claim 5, wherein said plurality of prepreg sheets comprise at least two prepreg sheets, one of said prepreg sheets containing a larger quantity of said resin than the other, said one of said prepreg sheets being laid between said core and said other prepreg sheet.

7. A process as set forth in claim 5, wherein said ceramic fibers comprise fibers selected from the group consisting of alumina, alumina silicate, mullite, spinel, beryllia, boron, boron nitride, silicon nitride, aluminum nitride, and glass fibers.

8. A process as set forth in claim 5, wherein said ceramic paper is impregnated with a synthetic resin selected from the group consisting of phenol, diallyl phthalate, epoxy, polyester, and polyimide resin.

9. A process as set forth in claim 5 wherein said core comprises aluminum.

10. A process as set forth in claim 6 wherein said core comprises aluminum.

11. A process as set forth in claim 5 wherein said core comprises aluminum.

12. A process as set forth in claim 7 wherein said core comprises aluminum.

13. A process as set forth in claim 8 wherein said core comprises aluminum.

* * * * *